United States Patent
Nguyen

(10) Patent No.: US 9,768,800 B1
(45) Date of Patent: Sep. 19, 2017

(54) ENVELOPE DEPENDENT OUTPUT STAGE SCALABILITY

(71) Applicant: Analog Devices, Inc., Norwood, MA (US)

(72) Inventor: Khiem Quang Nguyen, Tewksbury, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 15/264,421

(22) Filed: Sep. 13, 2016

(51) Int. Cl.
| | |
|---|---|
| H03M 1/06 | (2006.01) |
| H03M 3/00 | (2006.01) |
| H03F 3/45 | (2006.01) |
| H03M 1/12 | (2006.01) |

(52) U.S. Cl.
CPC .......... *H03M 3/50* (2013.01); *H03F 3/45273* (2013.01); *H03M 1/124* (2013.01); *H03M 3/322* (2013.01); *H03F 2200/102* (2013.01); *H03F 2200/435* (2013.01); *H03F 2203/45154* (2013.01)

(58) Field of Classification Search
CPC ........ H03M 3/50; H03M 3/322; H03M 1/124; H03F 3/45273
See application file for complete search history.

(56) References Cited

U.S. PATENT DOCUMENTS

| | | | |
|---|---|---|---|
| 5,041,747 A | 8/1991 | Chengson et al. | |
| 5,404,142 A | 4/1995 | Adams et al. | |
| 5,977,899 A | 11/1999 | Adams | |
| 6,078,614 A * | 6/2000 | Brown | G11B 5/0086 360/65 |
| 6,232,759 B1 | 5/2001 | Wohlfarth | |
| 6,278,750 B1 * | 8/2001 | Yu | H03M 3/484 341/143 |
| 6,753,732 B1 | 6/2004 | Moreland | |
| 6,865,230 B1 | 3/2005 | Adams et al. | |
| 7,009,541 B1 | 3/2006 | Nguyen | |
| 7,579,969 B2 * | 8/2009 | Tsividis | H03M 1/124 341/110 |
| 8,040,180 B2 | 10/2011 | Yen et al. | |
| 8,873,611 B2 * | 10/2014 | Hori | H03M 3/392 375/227 |
| 9,231,538 B1 | 1/2016 | Birkeland et al. | |
| 9,397,713 B1 | 7/2016 | Kirkpatrick | |
| 9,413,568 B2 * | 8/2016 | Yildirim | |
| 2003/0107412 A1 * | 6/2003 | Melsa | H03F 1/025 327/108 |

(Continued)

*Primary Examiner* — Lam T Mai

(74) *Attorney, Agent, or Firm* — Schwegman Lundberg & Woessner, P.A.

(57) ABSTRACT

An apparatus comprises a digital to analog converter (DAC) circuit configured to receive a time-varying a digital input signal and convert the digital input signal to an analog output signal, an output amplifier circuit operatively coupled to the output of the DAC circuit, a peak detector circuit operatively coupled to the input the DAC and configured to produce a signal envelope of the digital input signal, and logic circuitry. The logic circuitry is operatively coupled to the peak detector circuit and is configured to detect when the signal envelope satisfies a specified threshold value; and to adjust a drive capability of an output amplifier circuit of the DAC circuit according to the signal envelope.

22 Claims, 4 Drawing Sheets

(56) References Cited

U.S. PATENT DOCUMENTS

| | | | | |
|---|---|---|---|---|
| 2006/0170576 | A1* | 8/2006 | Weibiao | H03M 3/334 341/143 |
| 2009/0291648 | A1* | 11/2009 | Lee | H03M 1/661 455/102 |
| 2010/0164769 | A1* | 7/2010 | Lee | H03M 3/486 341/132 |
| 2011/0058601 | A1* | 3/2011 | Kim | H03F 1/0266 375/238 |
| 2014/0254836 | A1* | 9/2014 | Tong | H04R 1/2803 381/120 |
| 2015/0025852 | A1* | 1/2015 | Fukuchi | G01T 1/2928 702/189 |
| 2015/0249466 | A1* | 9/2015 | Elyada | H03M 1/70 341/144 |
| 2016/0204809 | A1 | 7/2016 | Pratt et al. | |

\* cited by examiner

ENVELOPE DEPENDENT OUTPUT STAGE SCALABILITY

BACKGROUND

Electronic systems can include digital-to-analog (D/A) converters (DACs). A DAC receives a digital input signal and converts the digital input signal to an analog output signal. A time varying digital input signal can be converted by the DAC into a time varying analog output signal. The sigma delta. DAC is one type of DAC and can be used in converting digital signals to continuous time analog signals for use in the audio band and for precision industrial measurement applications. To continue to increase functionality and performance of electronic systems, reducing power consumption by the systems can be a challenge. The present inventor has recognized a need for improved performance of DACs.

OVERVIEW

This document relates generally to sigma delta DAC circuits, and in particular to reducing current consumption in DAC circuits. An example apparatus includes a DAC circuit configured to receive a time-varying a digital input signal and convert the digital input signal to an analog output signal, an output amplifier circuit operatively coupled to the output of the DAC circuit, a peak detector circuit operatively coupled to the input the DAC and configured to produce a signal envelope of the digital input signal, and logic circuitry. The logic circuitry is operatively coupled to the peak detector circuit and is configured to detect when the signal envelope satisfies a specified threshold value; and to adjust a drive capability of an output amplifier circuit of the DAC circuit according to the signal envelope.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
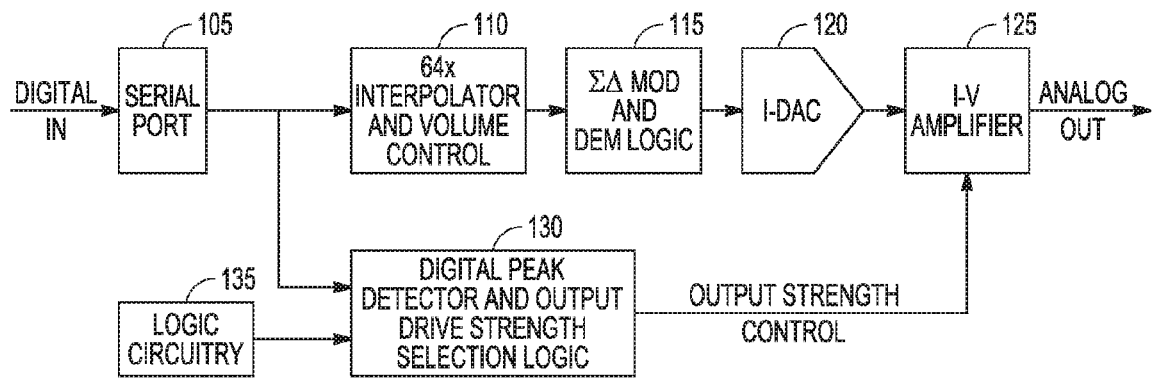
FIG. 1 is a block diagram of an example of a sigma delta digital-to-analog converter (DAC).

FIG. 1 is a block diagram of an example of portions of a sigma delta DAC. The digital input to the DAC is received at a serial port 105. The circuit includes an interpolation filter circuit stage 110 and sigma delta modulator circuit stage 115. The interpolation filter stage oversamples the digital input signal to increase the effective data rate (e.g., 64 times the input rate). The sigma delta modulator circuit stage 115 smooths discontinuities in the extra data points (e.g., using low pass filtering) and also filters outs quantization noise (e.g., using high pass filtering). Volume control may also be provided at the interpolation filter stage.

The DAC stage circuit 120 may be a multi-bit DAC and the sigma delta modulator circuit stage 115 may pass multiple bit streams to the multi-bit DAC. The output stage of the sigma delta DAC includes an output amplifier circuit 125. In some examples, the DAC stage circuit 120 is a current steering DAC (I-DAC) that produces an analog output current and the output amplifier circuit 125 is a current-to-voltage (I-V) amplifier. The majority of current consumption in the sigma delta DAC can be due to the output amplifier. One approach to reduce the current consumption in the output amplifier is to monitor the digital input and dynamically adjust the output drive capability of the output amplifier accordingly.

Figure 2:
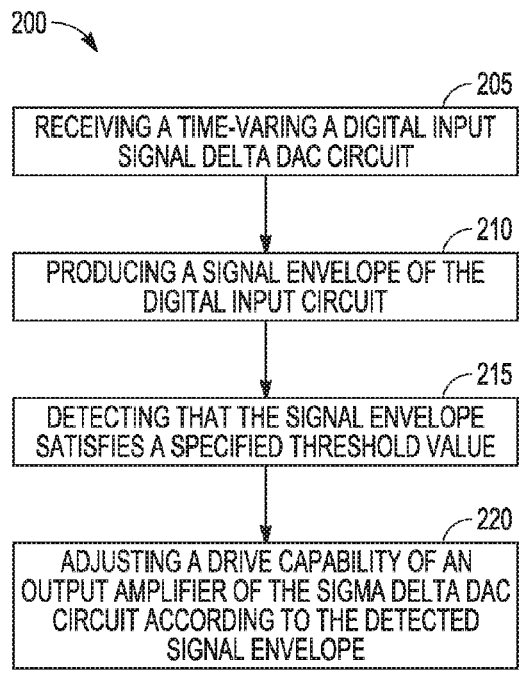
FIG. 2 is a flow diagram of an example of a method of controlling operation of a sigma delta DAC circuit.

FIG. 2 is a flow diagram of an example of a method 200 of controlling operation of a sigma delta DAC circuit. At 205, a time-varying a digital input signal is received at an input to the sigma delta DAC circuit. At 210, a signal envelope of the digital input signal is produced.

At 215, the circuit detects when the signal envelope satisfies a specified threshold value. A threshold value can be specified by using one or more reference voltages, and the sigma delta DAC circuit may detect when a threshold value is satisfied using a comparison with a reference voltage. At 220, the drive capability of the output amplifier of the sigma delta DAC circuit is adjusted according to the detected signal envelope. The drive capability may be increased when the signal envelope is larger, and the drive capability may be decreased when the signal envelope is smaller.

Figure 3:
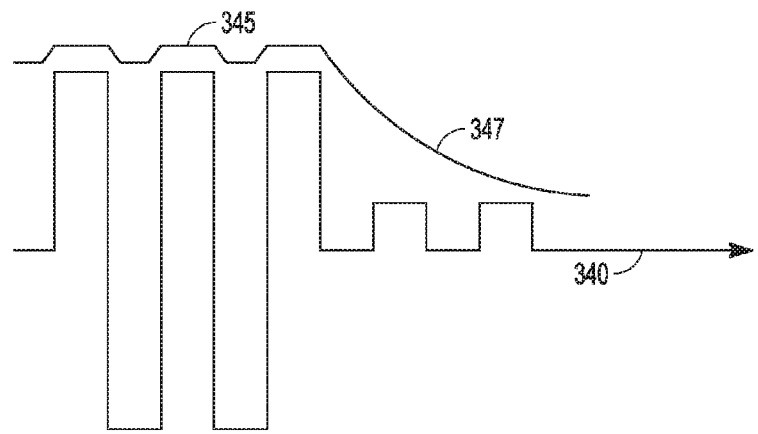
FIG. 3 is a graphical representation of a signal envelope of a digital signal.

Returning to FIG. 1, the sigma delta DAC includes a peak detector circuit 130 and logic circuitry 135. The peak detector circuit 130 produces a signal envelope of the digital signal and provides the signal envelope to the logic circuitry 135. FIG. 3 is a graphical representation of a changing amplitude of a digital signal 340 and a signal envelope 345 of the peak of the envelope of the digital signal. FIG. 3 shows that the envelope has a decay 347 as the magnitude of the digital signal decreases.

Figure 4:
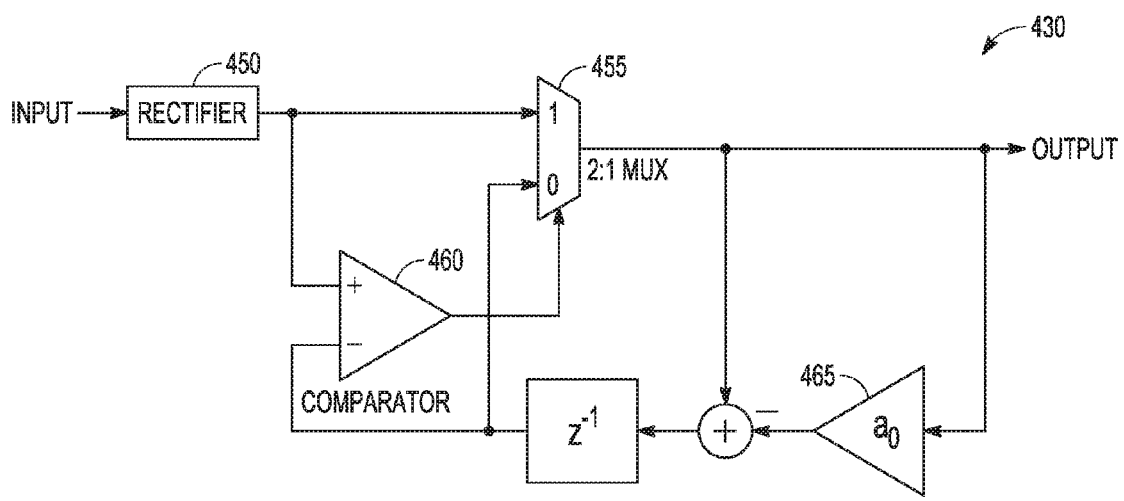
FIG. 4 is a block diagram of portions of an example of a digital peak detector circuit.

FIG. 4 is a block diagram of portions of an example of a peak detector circuit 430 that creates signal envelope information. The peak detector circuit 430 includes a rectifier 450, a multiplexer 455, a comparator 460 and a buffer 465. The peak detector circuit 430 may include discrete components or may be implemented using a digital signal processor (DSP). The gain $a_0$ of the buffer 465 sets the decay factor of the peak detector circuit.

Returning to FIG. 1, the logic circuitry 135 may include a logic sequencer circuit. A logic sequencer circuit proceeds through a fixed series of states or steps in which one or more control signals may be generated to initiate performance of specified functions. In certain examples, the logic circuitry 135 can be implemented using hardware circuits or firmware. In variations, the logic circuitry 135 can be implemented using a processor circuit such as a microprocessor circuit performing steps specified by software or firmware. The logic circuitry 135 detects when the signal envelope satisfies a specified threshold value, and adjusts a drive capability of an output amplifier circuit 125 of the DAC circuit according to the signal envelope.

As explained previously herein, a threshold value may be specified by using a voltage reference. In certain variations, the threshold value can be a specified fraction of the full-scale signal envelope. For instance, the logic circuitry may decrease the drive capability of the output amplifier when the decaying signal envelope decreases below a specified fraction of the full-scale signal envelope that corresponds to a full scale digital input signal.

Figure 5:
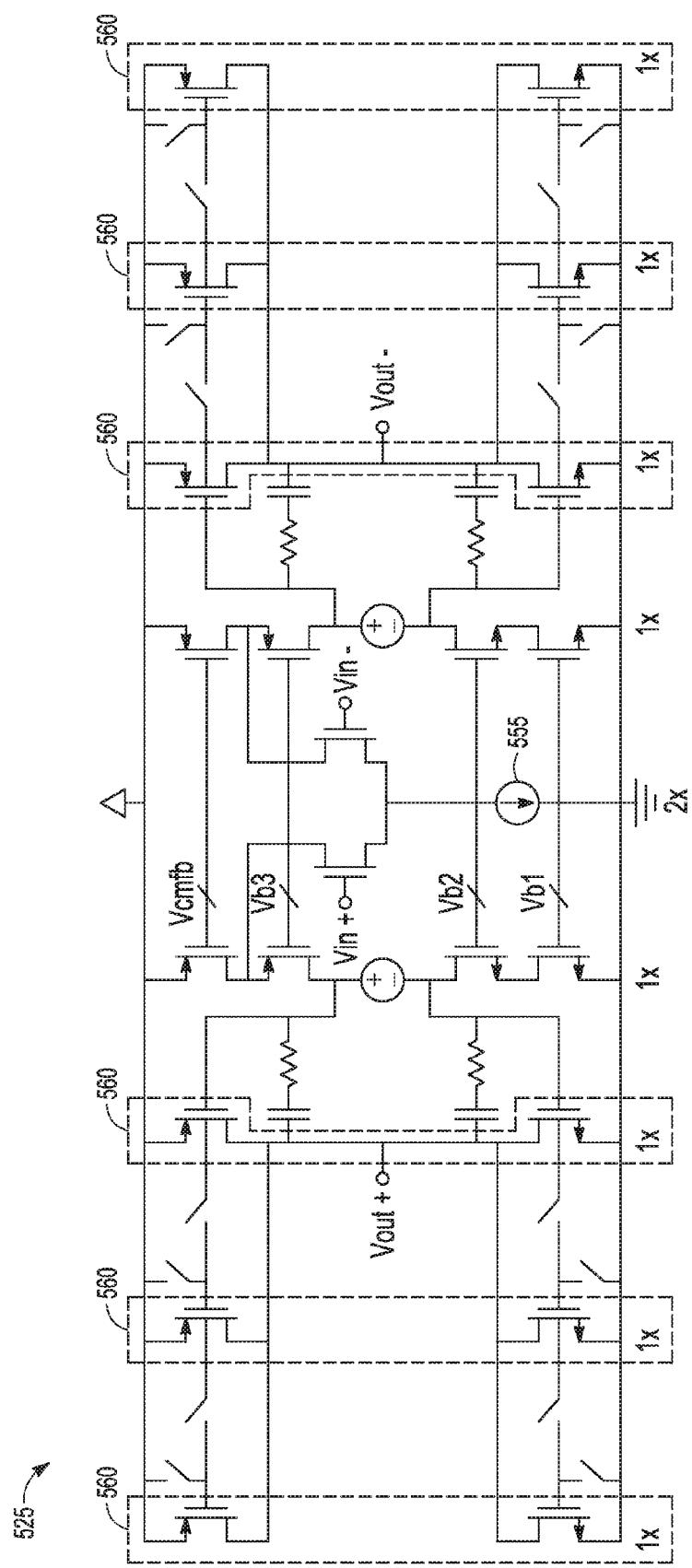
FIG. 5 is a schematic of a current-voltage (IN) amplifier circuit.

FIG. 5 is a schematic of an I-V amplifier circuit 525 usable as an output amplifier for a sigma delta DAC. The I-V amplifier circuit 525 is a differential input, differential out amplifier and includes a bias current source 555 connected to bias the differential input transistor pair. The I-V amplifier circuit also includes multiple parallel devices 560 in the two output drive stages. The parallel devices 560 can be current mirrors that mirror the current in the bias current source 555. To adjust the drive capability of the I-V amplifier circuit, the logic circuitry may increase the current in the bias current source to add drive to the output stage when the signal envelope is large and thereby increase the signal to noise ratio (SNR). The logic circuitry may also reduce the bias current in the bias current source to reduce the drive capability when the signal envelope is small and thereby conserve power consumption. This adjusting can be viewed as adjusting the total bias current of the amplifier, such that the entire amplifier bias current is scaled down or scaled up as necessary.

In some examples, the logic circuitry adjusts the drive capability by adjusting the bias current only in the output stages. For instance, the parallel devices 560 can be switchable current mirrors. Each current mirror can mirror the current in the bias current source 555 or a multiple of the current. The logic circuitry may adjust the output stage bias current by adding or subtracting (e.g., enabling or disabling) current mirrors to the output drive stage. In the example of FIG. 5, only three switchable current mirrors are shown for simplicity, although there may be many more switchable current mirrors in an implemented output amplifier circuit. Each current mirror shown mirrors the bias current one time (1×).

The logic circuitry can increase the current in only the output drive stages to add drive to the output stage when the signal envelope is large by activating more of the current mirrors, and can reduce the bias current in the output stage when the signal envelope is small by deactivating current mirrors. It can be seen that multiple thresholds may be used to activate and deactivate different numbers of current mirrors. In some examples, a combination of adjustment of both the current in the bias current source 555 and the number of active current mirrors are adjusted to adjust the drive capability of the output amplifier.

The logic circuitry may use hysteresis when adjusting the output drive capability of the output amplifier. For instance, the logic circuitry may increase the output drive capability from first drive level to a second drive level when the signal envelope increases from a first envelope level to a second envelope level that is above a first threshold, but not change the outdrive back to the first level unless the signal envelope decreases to a third envelope level that is higher than the first envelope level but less than the second envelope level. Hysteresis can help reduce chatter if the sigma delta DAC is used in an audio application or help remove instability in an industrial control application.

Figure 6:
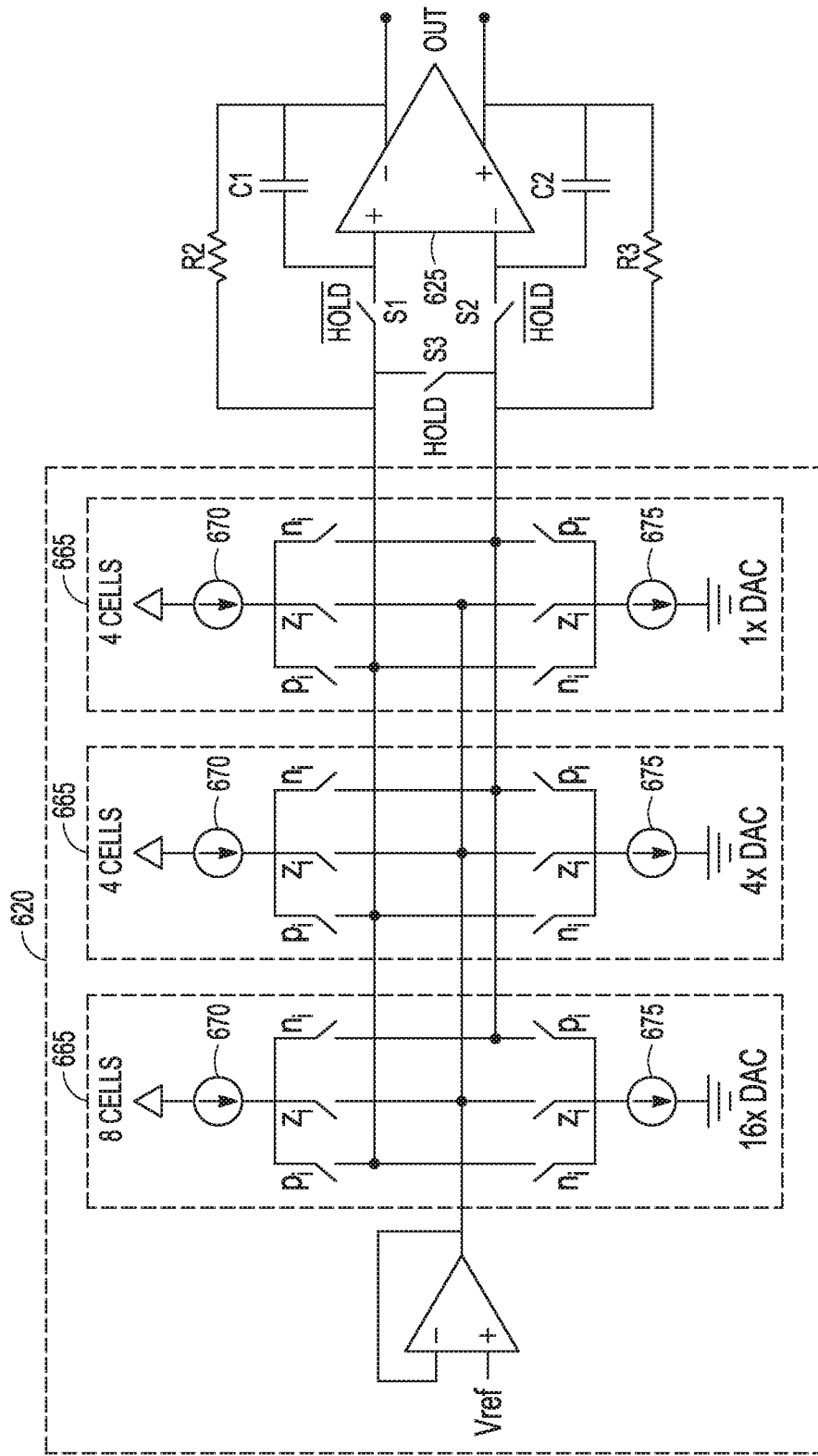
FIG. 6 is a schematic of portions of another example of a sigma DAC circuit.

FIG. 6 is a schematic of portions of another example of a sigma DAC circuit. The example shows an output amplifier circuit 625 connected to a DAC circuit stage 620. The logic circuitry cycles the DAC circuit stage 620 through conversion states and blanking states. The DAC circuit stage 620 shows multiple DAC cells 665 each of multiple bits. Each DAC cell includes switches "p", "z" and "n". The switches steer current from a top current source 670 and bottom current source 675. During a conversion cycle, current is applied to the inputs of the output amplifier circuit 625 by activating the "p" switches and the top current path is applied to the inputs of the output amplifier circuit 625. The current applied to the inputs of the output amplifier circuit is then reversed by activating the "n" switches.

The DAC output current is converted into a voltage developed across the resistors R2, R3 and the resulting voltage may be amplified by the output amplifier circuit 625. At the beginning of each conversion when the "p" switches and the "n" switches are activated, the output amplifier is placed in a hold state and the HOLD signal is activated to activate or close switch S3, and switches S1 and S2 are deactivated or open. This allows the new state of the DAC circuit stage 620 to settle. When the DAC is not in the hold state, the HOLD signal is inactive and switches S1 and S2 are active and S3 is deactivated. The "z" switches are enabled during the blanking state and current is not applied to the output amplifier circuit. The logic circuitry may adjust the drive capability during the blanking state of the DAC circuit.

The several devices and methods described herein can reduce the power consumption of a sigma delta DAC by automatically and dynamically adjusting the drive capability of the output amplifier circuit as needed while maintaining good a SNR and reduced total harmonic distortion (THD).

ADDITIONAL DESCRIPTION AND EXAMPLES

Example 1 includes subject matter (such as an apparatus) comprising a digital-to-analog converter (DAC) circuit configured to receive a time-varying a digital input signal and convert the digital input signal to an analog output signal; an amplifier circuit operatively coupled to the output of the DAC circuit; a peak detector circuit operatively coupled to the input of the DAC circuit and configured to produce a signal envelope of the digital input signal; and logic circuitry operatively coupled to the peak detector circuit and configured to detect when the signal envelope satisfies a specified threshold value; and adjust a drive capability of the amplifier circuit according to the signal envelope.

In Example 2, the subject matter of Example 1 optionally includes logic circuitry configured to cycle the DAC circuit through a blanking state and a conversion state; and to adjust the drive capability of the amplifier circuit during the blanking state of the DAC circuit.

In Example 3, the subject matter of one or both of Examples 1 and 2 optionally includes logic circuitry configured to adjust the bias current of the amplifier circuit.

In Example 4, the subject matter of one or any combination of Examples 1-3 optionally includes logic circuitry configured to adjust the bias current in the output stage of the amplifier circuit.

In Example 5, the subject matter of one or any combination of Examples 1-4 optionally includes logic circuitry configured to: detect when the signal envelope is greater than a first specified threshold value; increase the drive capability of the amplifier circuit from a first drive level to a second drive level when the signal envelope is greater than the first specified threshold value; detect when the signal envelope is less than a second specified threshold value, wherein the second specified threshold value is less than the first specified threshold value; and decrease the drive capability of the amplifier circuit from the second drive level to the first drive level when the signal envelope is less than the second specified threshold value.

In Example 6, the subject matter of Example 5 optionally includes logic circuitry configured to: detect when the signal envelope is greater than a third specified threshold value, wherein the third specified threshold value is greater than the first specified threshold value; increase the drive capability of the amplifier circuit from the drive level to a third drive level when the signal envelope is greater than the third specified threshold value; detect when the signal envelope is less than a fourth specified threshold value, wherein the fourth specified threshold value is less than the third specified threshold value and greater than the first specified threshold value; and decrease the drive capability of the output amplifier from the third drive level to the second drive level when the signal envelope is less than the fourth specified threshold value.

In Example 7, the subject matter of one or any combination of Examples 1-6 optionally includes an amplifier circuit that includes a differential output stage and the logic circuitry is configured to adjust the drive capability of the differential output stage according to the detected signal envelope.

In Example 8, the subject matter of one or any combination of Examples 1-7 optionally includes a DAC circuit that is a current steering DAC circuit and the amplifier circuit is a current to voltage amplifier circuit.

In Example 9, the subject matter of one or any combination of Examples 1-8 optionally includes an amplifier circuit that includes a plurality of current mirror circuits and the logic circuitry is configured to scale the drive capability of the output amplifier by enabling and disabling the current mirror circuits according to the detected signal envelope.

In Example 10, the subject matter of one or any combination of Examples 1-9 optionally includes a peak detector circuit configured to produce a decaying signal envelope when the digital input signal decreases; and logic circuitry configured to decrease the drive capability of the amplifier circuit when the decaying signal envelope decreases below a specified threshold value.

In Example 11, the subject matter of one or any combination of Examples 1-10 optionally includes logic circuitry configured to decrease the drive capability of the amplifier circuit when the decaying signal envelope decreases below a specified fraction of the signal envelope resulting from a full scale digital input signal.

Example 12 includes subject matter (such as a method of operating an ambulatory medical device, a means for performing acts, or a machine-readable medium including instructions that, when performed by the machine, cause the machine to perform acts), or can optionally be combined with the subject matter of one or any combination of Examples 1-11 to include such subject matter, comprising: receiving a time-varying a digital input signal at the sigma delta. DAC circuit; producing a signal envelope of the digital input signal; detecting that the signal envelope satisfies a specified threshold value; and adjusting a drive capability of an output amplifier of the sigma delta DAC circuit according to the detected signal envelope.

In Example 13, the subject matter of Example 12 optionally includes cycling the sigma delta DAC circuit through a blanking state and a conversion state, wherein the adjusting the drive capability includes adjusting the drive capability during the blanking state of the sigma delta DAC circuit.

In Example 14, the subject matter of one or both of Examples 12 and 13 optionally include detecting when the signal envelope is greater than a first specified threshold value; increasing the drive capability of the output amplifier from a first drive level to a second drive level when the signal envelope is greater than the first specified threshold value; detecting when the signal envelope is less than a second specified threshold value, wherein the second specified threshold value is less than the first specified threshold value; and decreasing the drive capability of the output amplifier from the second drive level to the first drive level when the signal envelope is less than the second specified threshold value.

In Example 15, the subject matter of one or any combination of Examples 12-14 optionally includes detecting when the signal envelope is greater than a third specified threshold value, wherein the third specified threshold value is greater than the first specified threshold value; increasing the drive capability of the output amplifier from the drive level to a third drive level when the signal envelope is greater than the third specified threshold value; detecting when the signal envelope is less than a fourth specified threshold value, wherein the fourth specified threshold value is less than the third specified threshold value and greater than the first specified threshold value; and decreasing the drive capability of the output amplifier from the third drive level to the second drive level when the signal envelope is less than the fourth specified threshold value.

In Example 16, the subject matter of one or any combination of Examples 12-15 optionally includes scaling a bias current of the output stage of the output amplifier according to the detected signal envelope.

Example 17 includes subject matter (such as a sigma delta digital-to-analog converter circuit), or can be combined with one or any combination of Examples 1-16 to include such subject matter comprising: an interpolation filter circuit configured to receive a time-varying digital input signal; a modulator circuit operatively coupled to the interpolation filter circuit and configured to produce a modulated digital signal having a different number of bits than the received digital input signal; a digital to analog converter (DAC) circuit operatively coupled to the modulator circuit and configured to convert the modulated digital signal to an analog output signal; an output amplifier circuit operatively coupled to the output of the DAC circuit; a peak detector circuit operatively coupled to the interpolation circuit and configured to produce a signal envelope of the received digital input signal; and logic circuitry operatively coupled to the peak detector circuit and configured to detect when the signal envelope satisfies a specified threshold value and to adjust a drive capability of the output amplifier according to the signal envelope.

In Example 18, the subject matter of Example 17 optionally includes logic circuitry configured to cycle the DAC circuit through a blanking state and a conversion state, and adjust the drive capability during the blanking state of the DAC circuit.

In Example 19, the subject matter of one or both of Examples 17 and 18 optionally includes logic circuitry configured to: detect when the signal envelope is greater than a first specified threshold value; increase the drive capability of the output amplifier from a first drive level to a second drive level when the signal envelope is greater than the first specified threshold value; detect when the signal envelope is less than a second specified threshold value, wherein the second specified threshold value is less than the first specified threshold value; and decrease the drive capability of the output amplifier from the second drive level to the first drive level when the signal envelope is less than the second specified threshold value.

In Example 20, the subject matter of one or any combination of Examples 17-19 optionally includes a DAC circuit that is a current steering DAC circuit and the output amplifier is a current to voltage amplifier.

In Example 21, the subject matter of one or any combination of Examples 17-20 optionally includes a differential output stage and the logic circuitry is configured to adjust the drive capability of the differential output stage according to the detected signal envelope.

In Example 22, the subject matter of one or any combination of Examples 17-21 optionally includes an output amplifier that includes a plurality of current mirror circuits and the logic circuitry is configured to scale the drive capability of the output amplifier by enabling and disabling the current mirror circuits according to the detected signal envelope.

These non-limiting examples can be combined in any permutation or combination. The above detailed description includes references to the accompanying drawings; which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." in this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 CFR. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
    a digital-to-analog converter (DAC) circuit configured to receive a tune-varying a digital input signal and convert the digital input signal to an analog output signal;
    an amplifier circuit operatively coupled to an output of the DAC circuit;
    a peak detector circuit operatively coupled to an input the DAC circuit and configured to produce a signal envelope of the digital input signal; and
    logic circuitry operatively coupled to the peak detector circuit and configured to detect when the signal envelope satisfies a specified threshold value; and
    adjust a drive capability of the amplifier circuit according to the signal envelope.

2. The apparatus of claim 1, wherein the logic circuitry is configured to cycle the DAC circuit through a blanking state and a conversion state, and to adjust the drive capability of the amplifier circuit during the blanking state of the DAC circuit.

3. The apparatus of claim 1, wherein the logic circuitry is configured to adjust a bias current of the amplifier circuit.

4. The apparatus of claim 1, wherein the logic circuitry is configured to adjust a bias current in an output stage of the amplifier circuit.

5. The apparatus of claim 1, wherein the logic circuitry is configured to:
    detect when the signal envelope is greater than a first specified threshold value;
    increase the drive capability of the amplifier circuit from a first drive level to a second drive level when the signal envelope is greater than the first specified threshold value;
    detect when the signal envelope is less than a second specified threshold value, wherein the second specified threshold value is less than the first specified threshold value; and
    decrease the drive capability of the amplifier circuit from the second drive level to the first drive level when the signal envelope is less than the second specified threshold value.

6. The apparatus of claim 5, wherein the logic circuitry is configured to:
    detect when the signal envelope is greater than a third specified threshold value; wherein the third specified threshold value is greater than the first specified threshold value;
    increase the drive capability of the amplifier circuit from the drive level to a third drive level when the signal envelope is greater than the third specified threshold value;
    detect when the signal envelope is less than a fourth specified threshold value, wherein the fourth specified threshold value is less than the third specified threshold value and greater than the first specified threshold value; and
    decrease the drive capability of the amplifier circuit from the third drive level to the second drive level when the signal envelope is less than the fourth specified threshold value.

7. The apparatus of claim 1, wherein the amplifier circuit includes a differential output stage and the logic circuitry is configured to adjust the drive capability of the differential output stage according to the signal envelope.

8. The apparatus of claim 1, wherein the DAC is a current steering DAC circuit and the amplifier circuit is a current to voltage amplifier circuit.

9. The apparatus of claim 1, wherein the amplifier circuit includes a plurality of current mirror circuits and the logic circuitry is configured to scale the drive capability of the amplifier circuit by enabling and disabling the plurality of current mirror circuits according to the signal envelope.

10. The apparatus of claim 1, wherein the peak detector circuit is configured to produce a decaying signal envelope when the digital input signal decreases; and
   wherein the logic circuitry is configured to decrease the drive capability of the amplifier circuit when the decaying signal envelope decreases below a specified threshold value.

11. The apparatus of claim 10, wherein the logic circuitry is configured to decrease the drive capability of the amplifier circuit when the decaying signal envelope decreases below a specified fraction of the signal envelope resulting from a full scale digital input signal.

12. A method of controlling operation of a sigma delta digital-to-analog converter (DAC) circuit, the method comprising:
   receiving a time-varying a digital input signal at the sigma delta DAC circuit;
   producing a signal envelope of the digital input signal;
   detecting that the signal envelope satisfies a specified threshold value; and
   adjusting a drive capability of an amplifier circuit of the sigma delta DAC circuit according to the signal envelope.

13. The method of claim 12, including cycling the sigma delta DAC circuit through a blanking state and a conversion state, wherein the adjusting the drive capability includes adjusting the drive capability during the blanking state of the sigma delta DAC circuit.

14. The method of claim 12, wherein the adjusting the drive capability includes:
   detecting when the signal envelope is greater than a first specified threshold value;
   increasing the drive capability of the output amplifier from a first drive level to a second drive level when the signal envelope is greater than the first specified threshold value;
   detecting when the signal envelope is less than a second specified threshold value, wherein the second specified threshold value is less than the first specified threshold value; and
   decreasing the drive capability of the output amplifier from the second drive level to the first drive level when the signal envelope is less than the second specified threshold value.

15. The method of claim 14, wherein the adjusting the drive capability includes:
   detecting when the signal envelope is greater than a third specified threshold value, wherein the third specified threshold value is greater than the first specified threshold value;
   increasing the drive capability of the amplifier circuit from the drive level to a third drive level when the signal envelope is greater than the third specified threshold value;
   detecting when the signal envelope is less than a fourth specified threshold value; wherein the fourth specified threshold value is less than the third specified threshold value and greater than the first specified threshold value; and
   decreasing the drive capability of the amplifier circuit from the third drive level to the second drive level when the signal envelope is less than the fourth specified threshold value.

16. The method of claim 12; wherein adjusting the drive capability of the amplifier circuit includes scaling a bias current of the output stage of the output amplifier according to the detected signal envelope.

17. A sigma delta digital-to-analog converter circuit comprising:
   an interpolation filter circuit configured to receive a time-varying digital input signal;
   a modulator circuit operatively coupled to the interpolation filter circuit and configured to produce a modulated digital signal having a different number of bits than the time-varying digital input signal;
   a digital to analog converter (DAC) circuit operatively coupled to the modulator circuit and configured to convert the modulated digital signal to an analog output signal;
   an output amplifier circuit operatively coupled to an output of the DAC circuit;
   a peak detector circuit operatively coupled to the interpolation filter circuit and configured to produce a signal envelope of the time-varying digital input signal; and
   logic circuitry operatively coupled to the peak detector circuit and configured to detect when the signal envelope satisfies a specified threshold value and to adjust a drive capability of the output amplifier according to the signal envelope.

18. The sigma delta digital-to-analog converter circuit of claim 17, wherein the logic circuitry is configured to cycle the DAC circuit through a blanking state and a conversion state, and adjust the drive capability during the blanking state of the DAC circuit.

19. The sigma delta digital-to-analog converter circuit of claim 17, wherein the logic circuitry is configured to:
   detect when the signal envelope is greater than a first specified threshold value;
   increase the drive capability of the output amplifier from a first drive level to a second drive level when the signal envelope is greater than the first specified threshold value;
   detect when the signal envelope is less than a second specified threshold value, wherein second specified threshold value is less than the first specified threshold value; and
   decrease the drive capability of the output amplifier from the second drive level to the first drive level when the signal envelope is less than the second threshold value.

20. The sigma delta digital-to-analog converter circuit of claim 17, wherein the DAC circuit is a current steering DAC circuit and the output amplifier is a current to voltage amplifier.

21. The sigma delta digital-to-analog converter circuit of claim 17,
   wherein the output amplifier includes a differential output stage and the logic circuitry is configured to adjust the drive capability of the differential output stage according to the signal envelope.

22. The sigma delta digital-to-analog converter circuit of claim 21, wherein the output amplifier includes a plurality of current mirror circuits and the logic circuitry is configured to scale the drive capability of the output amplifier by enabling and disabling the current mirror circuits according to the detected signal envelope.

\* \* \* \* \*